United States Patent [19]

Doudoumopoulos

[11] Patent Number: 5,828,078
[45] Date of Patent: Oct. 27, 1998

[54] ELECTROSTATIC DISCHARGE PROTECTION USING HIGH TEMPERATURE SUPERCONDUCTORS

[75] Inventor: Nicholas A. Doudoumopoulos, Marina Del Rey, Calif.

[73] Assignee: Hughes Electronics, Los Angeles, Calif.

[21] Appl. No.: 740,279

[22] Filed: Oct. 25, 1996

Related U.S. Application Data

[63] Continuation of Ser. No. 506,308, Jul. 24, 1995, abandoned.

[51] Int. Cl.$^6$ .............................. H01L 29/06; H01L 29/00
[52] U.S. Cl. .............................. 257/30; 257/33; 257/358; 257/359; 257/363; 257/537; 257/663; 505/191; 505/239; 361/19; 361/58; 361/104
[58] Field of Search ................................ 257/30, 33, 358, 257/359, 363, 537, 663, 468, 469; 505/191, 239; 361/58, 19, 104

[56] References Cited

U.S. PATENT DOCUMENTS 4,922,367  5/1990  Hideto ....................................... 361/58

FOREIGN PATENT DOCUMENTS

| 300 434 A | 1/1989 | European Pat. Off. . | |
| 0367170 | 5/1990 | European Pat. Off. .................. | 257/30 |
| 63-278386 | 11/1988 | Japan ....................................... | 257/30 |
| 01 248696A | 10/1989 | Japan . | |
| E-867 | 12/1989 | Japan . | |
| 2192171 | 7/1990 | Japan ....................................... | 257/30 |
| 03 057282 | 3/1991 | Japan . | |
| E-1072 | 5/1991 | Japan . | |
| 5226707 | 9/1993 | Japan ....................................... | 257/663 |
| 6053559 | 2/1994 | Japan ....................................... | 257/33 |

Primary Examiner—William Mintel
Attorney, Agent, or Firm—G. R. Lindeen, III; W. K. Denson-Low

[57] ABSTRACT

The present invention presents an electrostatic discharge and power surge protected circuit board (10) and method for providing an electrostatic discharge and power surge protected circuit board. The protected circuit board (10) includes temperature sensitive conducting material (14) and semiconductor circuit components (12). The temperature sensitive conducting material (14) has a critical current density, provides a high impedance when the critical current density is exceeded, and preferably comprises a high temperature superconductor. Preferably, the temperature sensitive conducting material (14) and the semiconductor circuit components (12) are coupled in series. In a method aspect of the present invention, an electrostatic discharge protected circuit board (10) is provided by providing a current carrying mechanism (16) on the circuit board (10), and coupling the current carrying mechanism (16) to temperature sensitive conducting material (14). Preferably, the temperature sensitive conducting material (14) is a high temperature superconductor, such as yttrium barium copper oxide.

6 Claims, 1 Drawing Sheet

ELECTROSTATIC DISCHARGE PROTECTION USING HIGH TEMPERATURE SUPERCONDUCTORS

This is a continuation application Ser. No. 08/506,308, filed Jul. 24, 1995, now abandoned.

FIELD OF THE INVENTION

The present invention relates generally to protection of semiconductor circuits from electrostatic discharge (ESD) and more particularly to the use of high temperature superconductors on circuit boards to provide ESD protection.

BACKGROUND OF THE INVENTION

Semiconductor circuit fabrication continually seeks to reduce device configurations to increase device density and overall system speed. In reducing the size of these devices, the individual, physical layers that form these devices have also been reduced. For example, the gate oxide layer has become increasingly thinner with the reduction of typical transistor devices. The thinning of the gate oxide layer presents greater sensitivity of the devices to electrostatic discharge (ESD) which results in increased device breakdown.

In typical circuit board designs, back-to-back diode arrangements have been used between the supply rails and electrical connections to provide ESD protection on the boards. Unfortunately, these arrangements do not provide a series resistance between the connections and rails and thus do not always provide a sufficient amount of protection. Usually, large series resistances are considered ideal to combat the problem of ESD in electrical connections. However, large series resistances are impractical for most active current lines, such as bias and input/output lines.

Further, the lack of adequate ESD protection in highly value added stages of circuit production creates significant problems. ESD damage occurring at any stage of system in-line testing (SIT) increases costs by requiring complete disassembly of the system, replacement of the damaged circuit, and then reassembly of the system. The reassembly process also increases costs by requiring the repetition of qualification and validation testing procedures.

What is needed therefore is an ESD protection mechanism that provides a large series resistance for current carrying lines and reduces the problems associated with ESD damage during SIT stages of production.

The present invention addresses these needs.

SUMMARY OF THE INVENTION

The present invention presents an electrostatic discharge (ESD) and power surge protected circuit board and method for providing an ESD and power surge protected circuit board. The protected circuit board includes temperature sensitive conducting material and semiconductor circuit components. The temperature sensitive conducting material has a critical current density, provides a high impedance when the critical current density is exceeded, and preferably comprises a high temperature superconductor. The semiconductor circuit components are coupled to the temperature sensitive conducting material and include current carrying mechanisms and focal plane arrays. Preferably, the temperature sensitive conducting material and the semiconductor circuit components are coupled in series.

In a method aspect of the present invention, an ESD protected circuit board is provided by providing a current carrying mechanism on the circuit board, and coupling the current carrying mechanism to temperature sensitive conducting material. The temperature sensitive conducting material enters a high impedance state when a critical current density of the material is exceeded. Preferably, the temperature sensitive conducting material is a high temperature superconductor, such as yttrium barium copper oxide. The method further includes the step of epoxying the material to the board when the material is formed in die form. Alternatively, the method includes the step of providing a sapphire substrate for the circuit board. When a sapphire substrate is provided, the method also includes the steps of forming a layer of cesium oxide on the substrate, forming a layer of yttrium barium copper oxide over the cesium oxide, and patterning the layers in a predetermined pattern.

By the present invention, a circuit board used in reduced temperature settings, e.g., settings operating in environments having temperatures at or below 90K–100K, are better protected from ESD and power surges. The high impedance presented by the temperature sensitive conducting material when the critical current density of the material is exceeded allows the material to be readily used as the protective mechanism. Further, the lack of impedance presented by the material during cool circuit operation allows it to be used in series with other circuit components without providing any of the voltage reduction problems that standard resistance elements present in series arrangements. These and other advantages of the aspects of the present invention will be more fully understood in conjunction with the following detailed description and accompanying drawings.

BRIEF DESCRIPTION OF THE DRAWINGS

FIG. 1 illustrates block diagram of a circuit board formed in accordance with the present in on.

DETAILED DESCRIPTION OF THE INVENTION

The present invention is directed toward an improvement in ESD protection for an integrated circuit structure using high temperature superconductive material. The following description is presented to enable one of ordinary skill in the art to make and use the invention and is provided in the context of a patent application and its requirements. Various modifications to the preferred embodiment will be readily apparent to those skilled in the art and the generic principles and features described herein.

The present invention provides ESD protection on current carrying lines, i.e., bias and input/output lines, on an integrated circuit board by using a high temperature superconductor (HTS) material connected in series to the current carrying lines. The HITS material acts as a highly resistive element when its critical current density is exceeded and acts as a substantially nonresistive element during cool operation of the circuit. Thus, when an ESD event or power surge occurs on the circuit board, i.e., the critical current density of the HTS material increases, the HTS material provided in accordance with the present invention acts as a large resistance and appropriately diffuses the event to protect the circuit. Further, when the circuit is not operating during integration or storage at ambient temperature, the HTS material acts as protection resistance for the circuit board.

Figure 1:
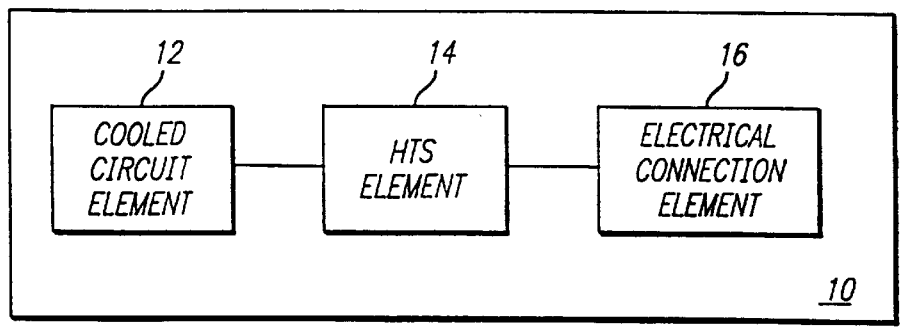

FIG. 1 illustrates an overall block diagram of a portion of a circuit board formed in accordance with the present invention. The circuit board 10 includes elements 12, 14, and 16. A cooled circuit element 12 is coupled to a high temperature superconductor (HTS) element 14. The HTS element 14 is further coupled to electrical connection elements 16. The electrical connection elements 16 preferably comprise current carrying lines, e.g., bias lines and input/output lines, for the cooled circuit element 12. A cooled circuit element for purposes of this application includes hardware devices, such as focal plane arrays (FPAs), space based and tactical sensor systems, and commercial devices, that normally operate at temperatures below approximately 90–100 Kelvin (K).

Figure 2:
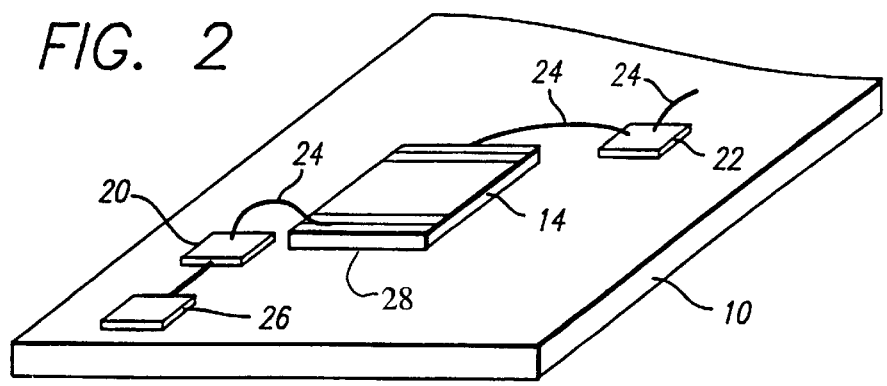
FIG. 2 illustrates in greater detail an ESD protected circuit board in accordance with a preferred embodiment of the present invention.

FIG. 2 illustrates in greater detail a partial view of the circuit board 10 formed in accordance with a preferred embodiment of the present invention. As shown in FIG. 2, the HTS element 14 electrically bonds to bonding pads 20 and 22 via bonding wires 24, as is well understood by those skilled in the art. Bonding pad 20 is electrically connected to input pad 26 by well known techniques. Bonding pad 22 is similarly electrically connected to the cooled circuit element (not shown).

The HTS element 14 in one preferred embodiment is formed as a discrete element or "die". The die preferably comprises an HTS material patterned on an HTS compatible substrate. By way of example, yttrium barium copper oxide patterned on a substrate of yttrium-stabilized zirconia by methods well known to those skilled in the art has been found by the inventor to work well. The formation of the HTS element 14 in die form allows connection of the HTS element 14 to be done in a well known manner. For example, the die is suitably epoxied onto the circuit board 10 in a manner similar to that used in the bonding of a bypass capacitor to a circuit board and then bonded to in series with the signal lines, as is well appreciated by those skilled in the art. A further advantage to forming the HTS element 14 as a die is the ability to mass produce the dies which eases the incorporation of the dies with any circuits or sensors as desired and makes the HTS element 14 as convenient to use as any other discrete circuit element.

In an alternate embodiment, the HTS element 14 is formed directly on the circuit board 10. For example, a base material of sapphire for the circuit board 10 is suitable for use as a substrate layer in the formation of the HTS element 14. Preferably, a layer of cesium oxide e.g., and intermediate layer 28, is formed as a buffer layer over the sapphire substrate. A layer of HTS material is then formed over the cesium oxide in a desired pattern to provide the HTS element 14 directly on the circuit board 10. The details of the steps of deposition and patterning are well known to one of skill in the art. By using this method of formation, the ESD protection for the circuit board is conveniently built-in to the circuit board itself.

The use of HTS element 14 in either a die form or a built-in manner provides more effective ESD protection on a circuit board by utilizing the characteristics of HTS materials. Preferably, for most circuit boards, a large resistance element is used as protection between any ESD sensitive circuitry and the input pads. Typically, the use of large resistance elements is possible only to a limited extent on clock lines and is not practical on current carrying lines, e.g., bias lines, due to the voltage drop across the large resistance. The HTS material used in accordance with the present invention, however, has properties which allow such deficiencies to be overcome in a convenient and straightforward manner.

The HTS material in its normal state, i.e., at temperatures above its critical temperature ($T_c$), acts as a resistive element, i.e., it protects the circuit node while not operating. As shown by the graph illustrating resistivity versus temperature for yttrium barium copper oxide in FIG. 3, at temperatures below about 90K ($T_c$), the material's resistivity drops to zero i.e. its presence is essentially transparent during operation. Thus, for a circuit used in a cooled environment ($T_{op}$ is less than $T_c$), the incorporation of HTS material in series with the input pads provides no added resistance and therefore no voltage drop under normal operation of the circuit. However, when the critical current density of the HTS material is exceeded, the HTS material behaves as a large resistance element. Thus, for ESD events or power surges that increase the circuit's current, the HTS material suitably provides a large series resistance on the current carrying lines to diffuse the event or surge and protect the discrete circuit elements. However, it should be appreciated that the HTS material chosen preferably has a high enough critical current density to avoid adding resistance during normal current spikes of sensor operation, such as during a reset operation, as is well understood by those skilled in the art.

Figure 3:
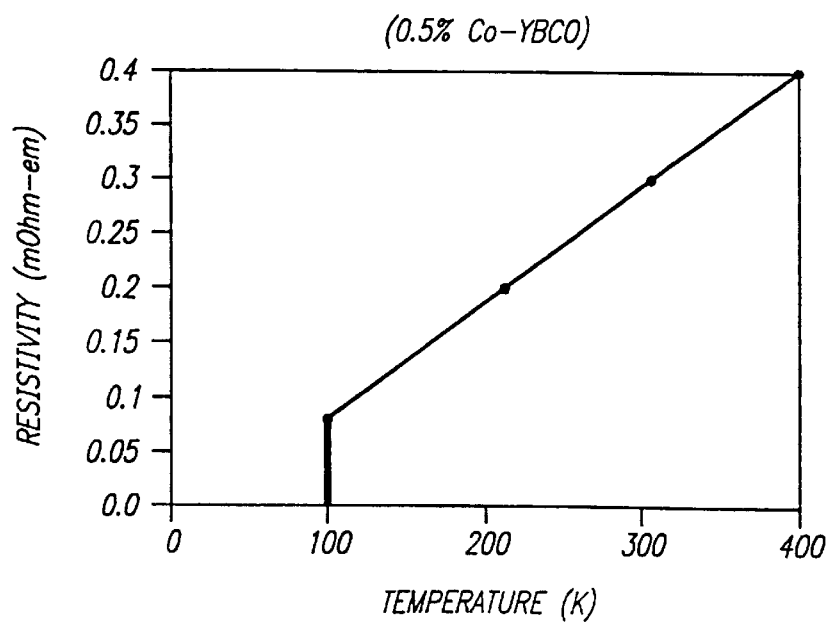
FIG. 3 is a graph the resistivity vs. temperature for yttrium barium copper oxide superconductor material.

A further advantage of the use of an HTS element for ESD protection is the ability to provide a temperature interlock on certain sensitive nodes of a sensor. For example, if a sensor used to detect voltage conditions is accidentally turned on warm, an HTS element provides high resistance, as shown by the graph of FIG. 3, and prohibits the warm activation of the sensor and its sensitive nodes, such as a voltage detector node, $V_{DETECTOR}$. Thus, when a circuit is not in operation, the HTS material acts as a protective mechanism for the circuit board. When in cool operation, however, the HTS material provides substantially zero resistance, as explained above, for normal operation of the sensor and its nodes.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined solely by the appended claims.

What is claimed is:

1. An electrostatic discharge and power surge protected circuit board consisting of:

a circuit board comprising a substrate and current carrying mechanisms and a temperature sensitive conducting material formed on said substrate integral with said circuit board and coupled to said current carrying mechanisms, said temperature sensitive conducting material having a critical current density and a high impedance when said critical current density is exceeded.

2. An electrostatic discharge and power surge protected circuit board consisting of:

a circuit board comprising a substrate and current carrying mechanisms;

an intermediate layer formed on said substrate; and a temperature sensitive conducting material formed on said intermediate layer integral with said circuit board and coupled to said current carrying mechanisms, said temperature sensitive conducting material having a critical current density and a high impedance when said critical current density is exceeded.

3. The invention of claim 2 wherein said substrate is sapphire.

4. The invention of claim 3 wherein said intermediate layer comprises cesium oxide.

5. The invention of claim 4 wherein the temperature sensitive material is yttrium barium copper oxide.

6. The invention of claim 2 wherein said circuit board further comprises at least one bonding pad and at least one input pad, the at least one bonding pad coupling the temperature sensitive conducting material to the at least one input pad.

* * * * *